(12) United States Patent
Patel et al.

(10) Patent No.: US 6,457,321 B1
(45) Date of Patent: Oct. 1, 2002

(54) SPRAY COOLING SYSTEM (75) Inventors: Chandrakant D. Patel, Fremont, CA (US); Cullen Bash, San Francisco, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 10/025,650

(22) Filed: Dec. 19, 2001

Related U.S. Application Data (63) Continuation of application No. 09/735,415, filed on Dec. 11, 2000, which is a continuation of application No. 09/395,092, filed on Sep. 13, 1999, now Pat. No. 6,205,799.

(51) Int. Cl.[7] .............................................. F25D 23/12
(52) U.S. Cl. .......................... 62/259.2; 62/64; 165/80.4
(58) Field of Search ............................... 62/259.2, 132, 62/116, 64; 165/80.4, 104.33; 361/699

(56) References Cited

U.S. PATENT DOCUMENTS

| | | | |
|---|---|---|---|
| 2,643,282 A | 6/1953 | Greene | 174/15 |
| 2,849,523 A | 8/1958 | Narbut | 174/15 |
| 2,858,355 A | 10/1958 | Narbut | 174/15 |
| 2,875,263 A | 2/1959 | Narbut | 174/15 |
| 3,714,793 A * | 2/1973 | Eigenbrod | 62/62 |
| 4,141,224 A | 2/1979 | Alger et al. | 62/514 R |
| 4,290,274 A | 9/1981 | Essex | 62/157 |
| 4,352,392 A | 10/1982 | Eastman | 165/104.25 |
| 4,490,728 A | 12/1984 | Vaught et al. | 346/1.1 |
| 4,500,895 A | 2/1985 | Buck et al. | 346/140 R |
| 4,559,789 A | 12/1985 | Riek | 62/157 |
| 4,576,012 A | 3/1986 | Luzenberg | 62/157 |
| 4,683,481 A | 7/1987 | Johnson | 346/140 R |
| 4,685,308 A | 8/1987 | Welker et al. | 62/171 |
| 4,794,410 A | 12/1988 | Taub et al. | 346/140 R |
| 4,897,762 A * | 1/1990 | Daikoku et al. | 361/382 |
| 5,220,804 A | 6/1993 | Tilton et al. | 62/64 |
| 5,278,584 A | 1/1994 | Keefe et al. | 346/140 R |
| 5,434,606 A | 7/1995 | Hindagolla et al. | 347/45 |
| 5,718,117 A | 2/1998 | McDunn et al. | 62/64 |
| 5,724,824 A | 3/1998 | Parsons | 62/171 |
| 5,768,103 A * | 6/1998 | Kobrinetz et al. | 361/699 |
| 5,813,237 A * | 9/1998 | Grace et al. | 62/52.1 |
| 5,907,473 A | 5/1999 | Prizilas et al. | 361/699 |
| 5,924,198 A | 7/1999 | Swanson et al. | 29/890.1 |
| 5,943,211 A | 8/1999 | Havey et al. | 361/699 |
| 6,108,201 A | 8/2000 | Tilton et al. | 361/689 |
| 6,182,742 B1 | 2/2001 | Takahashi et al. | 165/104.33 |

OTHER PUBLICATIONS

Sehmbey, M.S., Pais, M.R. and Chow, L.C., "Effect of Surface Material Properties and Surface Characteristics in Evaporative Spray Cooling," The Journal of Thermophysics & Heat Transfer, Jul.–Sep., 1992, vol. 6, No. 3, pp. 505–511.

Pais, Martin R., Chang, Ming J., Morgan, Michael J. and Chow, Louis C., Spray Cooling of a High Power Laser Diode, SAE Aerospace Atlanta Conference & Exposition, Dayton, Ohio, 1994, pp. 1–6.

Morgan, Michael J., Chang, Won S., Pais, Martin R. and Chow, Louis C., "Comparison of High Heat–Flux Cooling Applications," SPIE, 1992, vol. 1739, pp17–28.

Lee, Chin C., andChien, David H., "Thermal and Package Design of High Power Laser–Diodes," IEEE, 1993, Ninth IEEE Semi–Therm Symposium, pp 75–80.

(List continued on next page.)

Primary Examiner—Denise L. Esquivel
Assistant Examiner—Melvin Jones (57) ABSTRACT

A spray cooling system for semiconductor devices. An ink-jet type spray device sprays droplets of a cooling fluid onto the semiconductor devices. The devices vaporize the liquid, which gets passed through a roll bond panel, or other heat exchanger, and is pumped into a spring loaded reservoir that feeds the spray device.

29 Claims, 5 Drawing Sheets

OTHER PUBLICATIONS

Sehmbey, Mainder S., Chow, Louis C., Pais, Martin R. and Mahefkey, Tom, "High Heat Flux Spray Cooling of Electronics," American Institute of Physics, Jan., 1995, pp 903–909.

Mudawar, I. and Estes, K.A., "Optimizing and Predicting CHF in Spray Cooling of a Square Surface," Journal of Heat Transfer, Aug., 1996, vol. 118, pp 672–679.

Denney, D. Lawrence, "High Heat Flux Cooling Via a Monodisperse Controllable Spray", A Thesis Presented to The Academic Faculty of Georgia Institute of Technology in Partial Fulfillment of the Requirements for the Degree Master of Science in Mechanical Engineering, Mar. 1996.

* cited by examiner

SPRAY COOLING SYSTEM

The present application is a continuation of application Ser. No. 09/735,415, filed Dec. 11, 2000, which is a continuation of application Ser. No. 09/395,092, filed Sep. 13, 1999, now U.S. Pat. No. 6,205,799.

BACKGROUND OF THE INVENTION

This invention relates generally to cooling systems for heat-generating devices and, more particularly, to a spray cooling system and a method of using the spray cooling system to cool a heat source.

With the advent of semiconductor devices having increasingly large component densities, the removal of heat generated by the devices has become an increasingly challenging technical issue. Furthermore, typical processor boards can, in some instances, include multiple CPU modules, application-specific integrated circuits (ICs), and static random access memory (SRAM), as well as a dc-dc converter. Heat sinks can be used to increase the heat-dissipating surface area of such devices. However, heat sinks, and their interfaces to the cooled devices, can provide interference in the heat flow, and can lead to uneven cooling.

Known cooling methods for semiconductors include free-flowing and forced-air convection, free-flowing and forced-liquid convection, pool boiling (i.e., boiling a liquid cooling fluid off of a submerged device), and spray cooling (i.e., boiling a liquid cooling fluid off of a device being sprayed with the liquid). Because liquids typically have a high latent heat of vaporization, these latter two methods provide for a high heat-transfer efficiency, absorbing a large quantity of heat at a constant temperature. Typically, the cooling fluid used has a relatively low boiling point (the temperature to maintain) and is inert to the heat source. For semiconductor devices, FED. CIR.-72, i.e., Fluorinert®, sold by 3M Corporation, is one of a number of known suitable cooling liquids.

The use of these boiling/vaporizing methods is limited to a maximum power density, the critical heat flux (CHF). At higher densities, the vaporized cooling fluid forms a vapor barrier insulating the device from the liquid cooling fluid, thus allowing the wall temperature of the device to increase greatly. This phenomenon is referred to as pooling. When a coolant is properly sprayed, it can disperse such a vapor layer, and its CHF can be well over an order of magnitude higher than the CHF of a pool boiling system. This high CHF is reliant on having a uniform spray. Thus, spray cooling presently provides the most efficient cooling for a heat-generating device, such as a semiconductor device.

Typically, current sprayer designs employ either pressurized liquid spraying or pressurized gas atomizing. A number of factors affect the performance of spray cooling, thus affecting the heat transfer coefficient h and/or the CHF. It is commonly understood that surface roughness and wettability of the sprayed component are two of these factors, and the orientation of the surface being sprayed can be a third. In particular, it is believed that h is higher for rough surfaces when using a pressurized liquid spray, and for smooth surfaces when using gas atomizing. Surfaces with decreased wettability appear to have a marginal increase in h.

Critical to consistent, controlled cooling is the controlled application of the liquid cooling fluid in a desired distribution, flow rate, and velocity. For example, at a low mass flow rate, CHF and h increase with the mass flow rate. However, at a critical mass flow rate, the advantages of increased mass flow are diminished due to pooling and/or due to a transition to single phase heat transfer. Thus, a spray cooling system is preferably operated uniformly at a mass flow rate defined at a point before the critical mass flow rate is reached. All of these factors make critical the design of the sprayer, i.e., the design of the nozzle and its related spray devices.

Also important to the cooling system design is its operating temperature. In particular, it is desirable to configure the system to operate at a high h, which will occur with a design temperature above the boiling temperature and below a temperature that will dry out the sprayed coolant. The amount of heat to be dissipated must be less than the CHF.

For pressure-assisted spraying, consistent, controlled spraying requires one or more high pressure pumps that provide a precise pressure to pump the liquid through a nozzle, even at varying flow rates. Both the distribution and the flow rate of the sprayed liquid can change with variations in the driving pressure and/or small variations in the nozzle construction. Thus, the cooling system is a sensitive and potentially expensive device that can be a challenge to control.

For gas atomizing, consistent, controlled spraying requires a pressurized gas that is delivered to a sprayhead design in a precise manner. Because the gas must be pressurized separately from the cooling fluid, such systems are not typically closed systems. The gas must be bled out for the condenser to run efficiently. Furthermore, both the distribution and the flow rate of the cooling fluid can change with variations in the gas pressure. Thus, the cooling system is a sensitive and potentially expensive device that can be a challenge to control.

Accordingly, there has existed a need for an accurate, reliable and cost-efficient spray cooling system. The present invention satisfies these and other needs, and provides further related advantages.

SUMMARY OF THE INVENTION

The present invention provides a spray cooling system for cooling a heat source, embodiments of which can exhibit improved accuracy, reliability and/or cost efficiency. Embodiments of the invention typically feature an incremental sprayer configured to eject an incremental amount of the cooling fluid on the heat source. The cooling fluid is sprayed in response to a control signal, which is sent to the sprayer by a controller.

Advantageously, these features provide for accurate delivery of cooling fluid at precise and controllable rates. The technology for this type of incremental sprayer is well developed in the ink-jet printer arts, and it is relatively inexpensive to manufacture. Furthermore, the design can be modular, offering quickly and easily replaceable units.

The invention further features the use of thermal ink-jet technology in designing the sprayer. In particular, the embodiment of the invention may have a body defining a chamber configured to hold a volume of the cooling fluid, and defining an orifice in communication with the chamber. A heating element is in thermal communication with the chamber, and is configured to vaporize a portion of the cooling fluid held within the chamber. The orifice is configured to direct cooling fluid from the chamber to the heat source upon the heating element vaporizing a portion of the cooling fluid held within the chamber.

This technology generally provides for efficient delivery of the cooling fluid to the heat source. Some known inert cooling fluids have viscosities and boiling points similar to that of ink-jet ink, and the ink-jet sprayers are typically adaptable to use with the cooling fluids. Furthermore, unlike typical ink-jet ink, cooling fluid does not contain particulate matter that can clog the system. Thus, the system is both reliable and cost efficient to design.

The invention further features the ejection of incremental amounts of a cooling fluid on the heat source, using an incremental sprayer, spaced over a number of time increments. Either the incremental time or the amount ejected can be varied to adjust the flow rate to an optimal level. The system can be controlled by monitoring, either directly or indirectly, the temperature of the heat source and the amount of pooling or dry-out that is occurring, if any. This can provide for optimized cooling of a heat source.

Other features and advantages of the invention will become apparent from the following detailed description of the preferred embodiments, taken in conjunction with the accompanying drawings, which illustrate, by way of example, the principles of the invention.

DETAILED DESCRIPTION OF THE PREFERRED EMBODIMENTS

Figure 1:
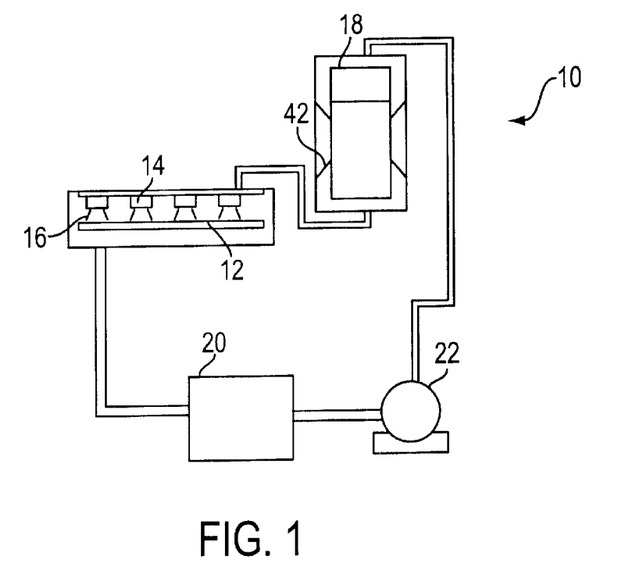
FIG. 1 is a schematic representation of a cooling system embodying features of the present invention.

An embodiment of a cooling assembly 10 for cooling a heat-generating semiconductor device 12, according to the present invention, is schematically shown in FIG. 1. The assembly includes a one or more incremental sprayers 14 for spraying an incremental amount of a liquid cooling fluid 16, preferably from a reservoir 18, onto the semiconductor device to evaporatively cool the semiconductor device. The assembly also includes a heat exchanger 20 to extract the heat from the vaporized cooling fluid, and thereby liquify or condense it. The assembly further includes a pump 22 to pump the liquified cooling fluid back into the reservoir that feeds the sprayers.

While incremental sprayers 14 that can be used as part of the present invention can be based on other types of ink-jet droplet expelling technology, such as piezoelectric technology (i.e., piezoelectric nozzles), they are preferably based on thermal ink-jet technology. Examples of this technology are discussed in numerous U.S. Pat. Nos. 5,924,198, 4,500,895, and 4,683,481, which are incorporated herein by reference. Other thermal ink-jet technologies can likewise be appropriate for use with this invention. A highly preferable cooling fluid for use with a thermal incremental sprayer is 3M Fluorinert®, which is easily adaptable to existing thermal ink-jet technology because it has a viscosity and boiling point similar to that of the inks typically used in ink-jet printers.

Figure 2:
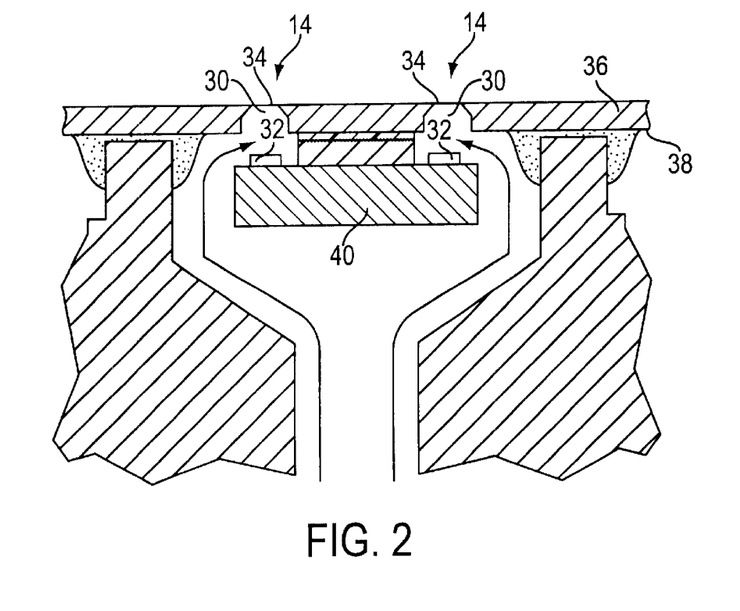
FIG. 2 is a cross-sectional view of a sprayer for the cooling system represented in FIG. 1.

With reference to FIG. 2, which depicts two simplified, exemplary incremental sprayers 14, each sprayer includes backing structure defining a chamber 30 for receiving a predetermined portion of the cooling fluid and a heater 32 for vaporizing a portion of the cooling fluid, to create the pressure to eject an incremental amount of the cooling fluid through an orifice 34 that directs the ejected cooling fluid toward the semiconductor device 12 (FIG. 1). The orifices are formed in a flexible polymer tape 36, e.g., tape commercially available as Kapton TM tape, from 3M Corporation.

Affixed to a back surface 38 of the tape 36 is a silicon substrate 40 containing the heaters 32, in the form of individually energizable thin-film resistors. Each heater is preferably located on a side of the chamber 30 across from the chamber's orifice 34. Cooling fluid is preferably drawn and loaded into the chamber by capillary action, as is typical for an ink-jet type device. A computerized controller (not shown) energizes the heater, vaporizing the portion of the cooling fluid adjacent to the heater. The vaporized cooling fluid expands, expelling most of the non-vaporized cooling fluid out of the orifice, typically in the form of a single droplet.

Depending on the configuration of the sprayer, the incremental amount of the fluid sprayed from the sprayer could be in the form of a single droplet, or in the form of multiple droplets. Multiple droplets could be produced by multiple orifices related to a single heater, or by sprayers having larger chamber volumes and appropriately shaped orifice nozzles to cause the incremental amount of fluid to break into droplets. After the chamber has been fired by the heater, capillary action again loads the chamber for a subsequent firing.

The liquid spray from the incremental sprayers 14 can be highly controllable. For example, by increasing or decreasing the frequency that the sprayers are energized, the flow rate can be accurately adjusted. Furthermore, because the sprayers can be configured to deliver very small quantities of cooling fluid, and because a large number of sprayers can be fit into a small area, the heat distribution over that area can be accurately controlled by energizing some of the sprayers at a rate greater than that of other sprayers.

With reference again to FIG. 1, to aid the reservoir 18 in providing the cooling fluid to the incremental sprayers 14, the reservoir can be configured with a spring assist mechanism 42. Alternatively, the reservoir can be positioned such that the cooling fluid receives a gravity assist in flowing to the sprayers 14. In addition to serving as a source of liquid cooling fluid, the reservoir also serves to separate any gas leaving the condenser. A filter (not shown) can be used, either in the reservoir or in some other portion of the system, to remove board level contaminants that are present in the system.

The pump 22 serves to replenish the reservoir 18, and can be a low-cost apparatus that does not provide either high pressure or consistent and controlled flow. Preferably the pump should be self priming to remove trapped gas.

The precise order of the components can be varied. For example, the pump 22 could be placed prior to the heat exchanger 20, so long as it can pump both vapors and fluids. Likewise, depending on the type of sprayer, the reservoir could be eliminated, and the pump could be used to directly feed the sprayers 14. The entire assembly 10, including the circuit board, is preferably a field-replaceable unit.

Figure 3:
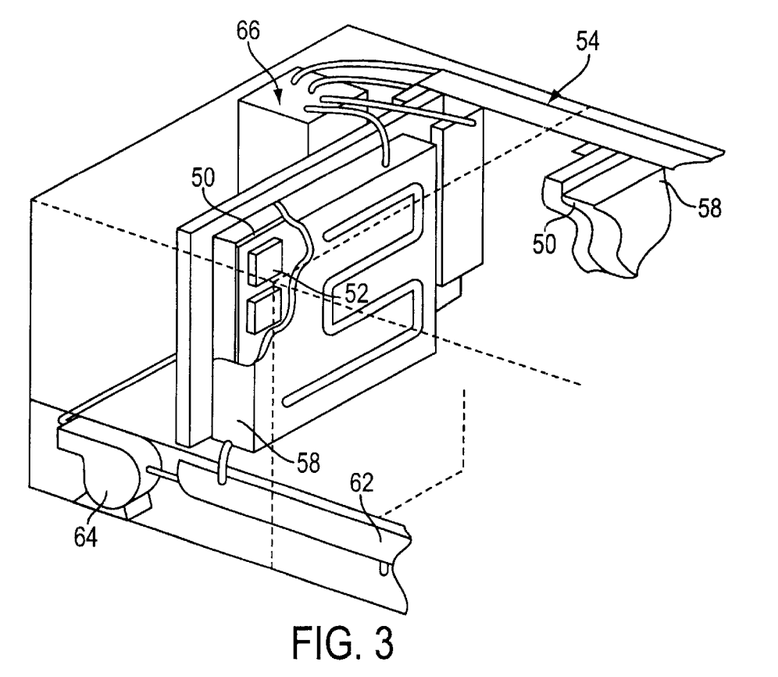
FIG. 3 is a cut-away perspective view of a first embodiment of the cooling system represented in FIG. 1.
Figure 4:
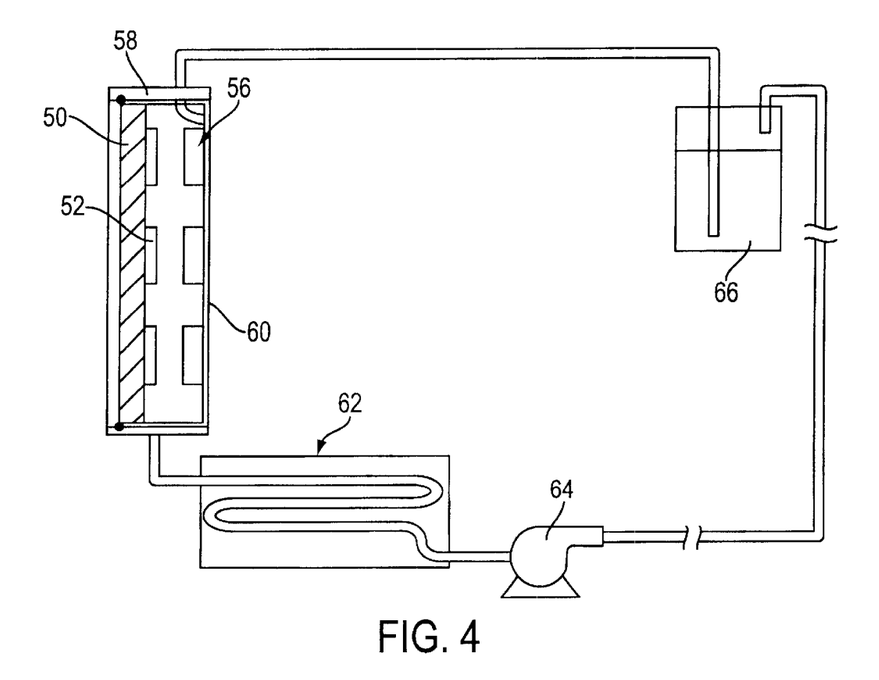
FIG. 4 is a cross-sectional view of the embodiment depicted in FIG. 3.

With reference now to FIGS. 3 and 4, multiple cooling systems within one computer (or other device) can be configured to share components. The computer can contain a plurality of circuit boards 50 carrying heat-generating components 52 such as CPUs, each circuit board typically being mounted on a backplane 54. Incremental sprayers 56 are located adjacent to the components, and are configured to spray the components with a cooling fluid. The components and sprayers are enclosed in a compartment 58 that prevents vaporized cooling fluid from escaping the system. A roll bond panel 60 serves as a first heat exchanger, condensing some or all of the vapor. The roll bond panel is formed as a wall of the sealed compartment. Suitable roll bond panels can be obtained from Showa Aluminum Corporation, of Tokyo, Japan, or from Algoods, of Toronto, Canada. A suitable low-boiling point working fluid, e.g., 3M Fluorinert®, is carried within fluid channels in the roll bond panel. Alternatively, working fluids such as hydrofluoroether or alcohol could be used.

A second heat exchanger 62, which can also be a roll bond panel, is located externally from the circuit board compartments 58, and provides for the additional condensing of vaporized cooling fluid. The second heat exchanger receives the cooling fluid, which can be both liquid and vaporized, from the compartments of each circuit board 50. After the cooling fluid has been further cooled by the second heat exchanger, a commonly shared pump 64 delivers the cooling fluid to a commonly shared reservoir 66, which in turn returns the cooling fluid to the sprayers 56 of each circuit board.

Figure 5:
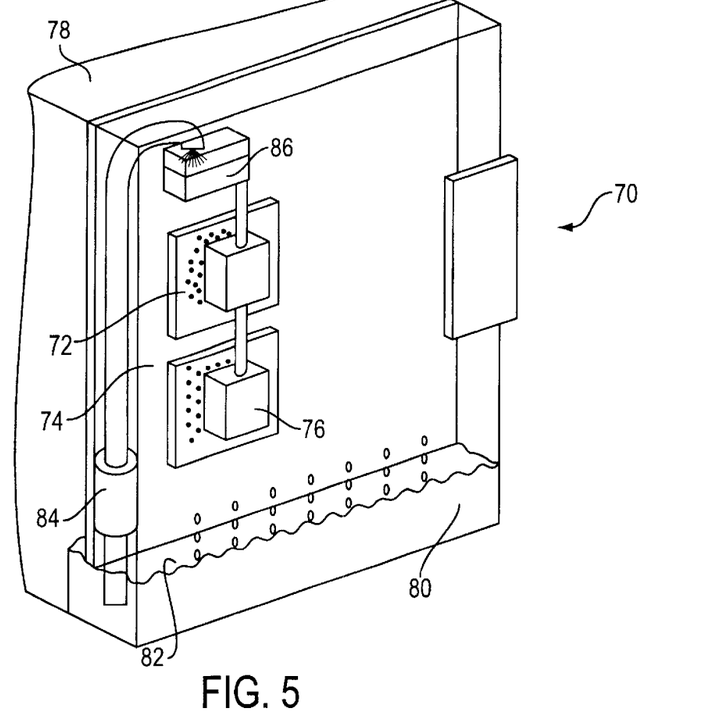
FIG. 5 is a cut-away perspective view of a second embodiment of the cooling system represented in FIG. 1.

With reference now to FIG. 5, the entire cooling system can be incorporated into a single circuit board assembly 70. The circuit board assembly will typically include heat-generating components 72 such as CPUs, mounted on a circuit board 74. Incremental sprayers 76 are located adjacent to the components, and are configured to spray the components with a cooling fluid. The components and sprayers are enclosed in a sealed compartment 78 that prevents vaporized cooling fluid from escaping. One or more roll bond panels 80 preferably are incorporated into one or more compartment walls, and are configured to condense vapor and release it into a collection reservoir 82 in the bottom of the circuit board assembly. The pool also receives non-vaporized coolant that drips from the components. A pump 84 pumps the cooling fluid up into a main feed reservoir 86, preferably being above the sprayers, which provides the cooling fluid to the sprayers. As an alternative to the reservoir's being located above the sprayers, which causes a gravity feed effect, the reservoir could incorporate some type of pressure mechanism, such as a spring.

Generally speaking, for embodiments of the invention to function at optimal efficiency, the sprayers' mass flow rate ($\dot{m}_s$) should be adjusted to avoid having the semiconductor device become either dry or immersed. This rate is controlled by having a controller adjust the rate that the thermal jets are fired. The optimum mass flow rate can change as the heat flux of the semiconductor device changes. Thus, for a controller to correctly control the mass flow, parameters of the semiconductor device and/or cooling system need to be sensed.

To determine whether the mass flow rate is at an optimal level, sensors can be used to track one or more of the system parameters. The types of parameters that are available vary with the type of system employed. For example, if the heat exchanger is external to the chamber where the spraying occurs, then the liquid and the vapor can be removed from the chamber through separate passages (with the assistance of a resistive mesh to inhibit entry of vapor into the liquid passage), and the mass flow of the vapor ($\dot{m}_v$) and/or mass flow of the liquid ($\dot{m}_l$) are available to be measured. However, these are not available if the heat exchanger is within the spray chamber, such as in the embodiment of FIG. 5. Instead, the vapor pressure within the spray chamber ($P_v$) and the semiconductor device's junction temperature can be sensed.

Figure 6:
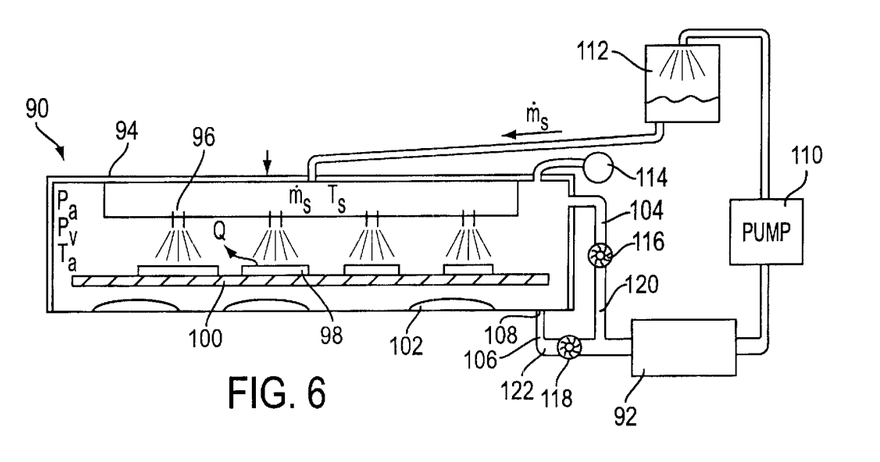
FIG. 6 is a cross-sectional view of a third embodiment of the cooling system represented in FIG. 1.

FIG. 6 depicts a cooling system 90 having a heat exchanger 92 external to a spray chamber 94. The spray chamber contains incremental sprayers 96 that spray a cooling fluid onto semiconductor devices 98 on a circuit board 100. Depending on the temperature of the semiconductor devices, some of the cooling fluid may vaporize, and some may run off to form a pool 102. Vapor exits the spray chamber through a vapor passage 104, while liquid exits via a liquid passage 106. A mesh 108 is used to prevent vapor from entering the liquid passage, while gravity prevents the liquid from entering the vapor passage. The vapor and liquid are combined and inserted into the heat exchanger 92, which removes heat and liquefies the vapor. A pump 110 draws the cooled cooling fluid up into a reservoir 112, where it is again provided to the sprayers.

A number of potentially useful system parameters can be sensed in this system, including: The temperature of the semiconductor devices ($T_j$) (i.e., the junction temperature), which can often be sensed from within the device; The ambient temperature ($T_a$) and pressure ($P_a$), as well as the vapor pressure ($P_v$), in the spray chamber 94, which can be sensed using temperature and pressure sensors 114 within the spray compartment; The mass flow of the vapor ($\dot{m}_v$) and the mass flow of the liquid ($\dot{m}_l$), which can be sensed using appropriate sensors 116, 118 in respective vapor and liquid passages 120, 122; The temperature ($T_{sc}$ of the sub-cooled liquid coming out of the heat pump 92, which can be sensed by a temperature sensor; And the temperature ($T_s$) of the liquid being received by the sprayer.

Figure 7:
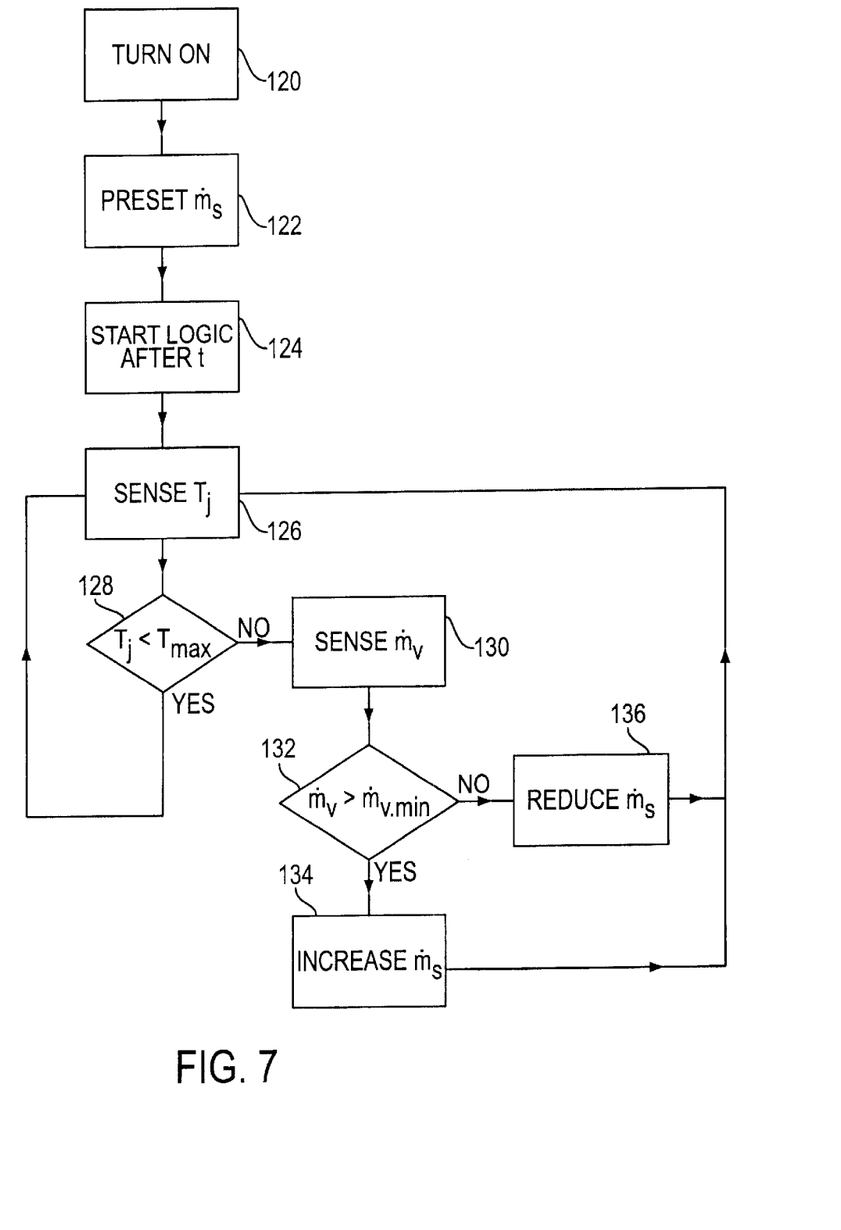
FIG. 7 is a control system block diagram for controlling the operation of the embodiment depicted in FIG. 6.

With reference to FIG. 7, a method of adjusting the sprayers' mass flow rate ($\dot{m}_s$) for the device depicted in FIG. 6 begins with the steps of by starting the cooling system 120 and setting 122 the sprayers' initial mass flow rate at an initial value ($\dot{m}_{s,init}$). This value typically would be based on prior experience with this system, or with systems of its type, but could also be based on calculated heat generations rates and cooling rates. A limited amount of time (t) is preferably allowed to pass 124 so that the system can begin functioning, and then the sensing logic begins to take action, i.e., the cooling system begins sensing and monitoring parameters and adjusting the sensors' mass flow rate.

In particular, the temperature of the semiconductor devices ($T_j$) is sensed 126, and the resulting sensor value is compared 128 to a selected maximum value $T_{max}$. If the resulting sensor value is below the selected maximum value then no action is taken, and the monitoring of parameters is repeated. If, however, the semiconductor device has reached the selected maximum value, then sensors are used to determine if pooling is occurring. Preferably, to detect pooling, the mass flow of the vapor ($\dot{m}_v$) is sensed 130 and compared 132 to a selected minimum value ($\dot{m}v_{min}$) to verify that it is above that value $\dot{m}_{v,min}$. The selected minimum value ($\dot{m}_{v,min}$) typically would be based on prior experience with this system, or with systems of its type, but could also be based on calculated heat generations rates and cooling rates.

If the mass flow of the vapor ($\dot{m}_v$) is above the selected minimum value, then pooling is not a problem, and the sprayers' mass flow rate should be increased 134 to reduce the temperature ($T_j$). However, if the mass flow rate of the vapor is not above the minimum value, then pooling is occurring and the sprayers' mass flow rate is decreased 136 to increase the cooling system's effectiveness. After the sprayers' mass flow rate is incrementally adjusted, either up or down, the monitoring is continued by again sensing the temperature of the semiconductor devices ($T_j$). It should be noted that the orientation of the sprayed surface (with respect to gravity) might have an effect on the accurate sensing of pooling, and that experimentation can be used to verify and/or adjust the selected minimum value $\dot{m}_{v,min}$ accordingly.

In the alternative, other sensors can be used to determine if pooling is occurring. For example, the vapor pressure ($P_v$) in the spray chamber is a more direct measure of whether pooling is occurring.

Figure 8:
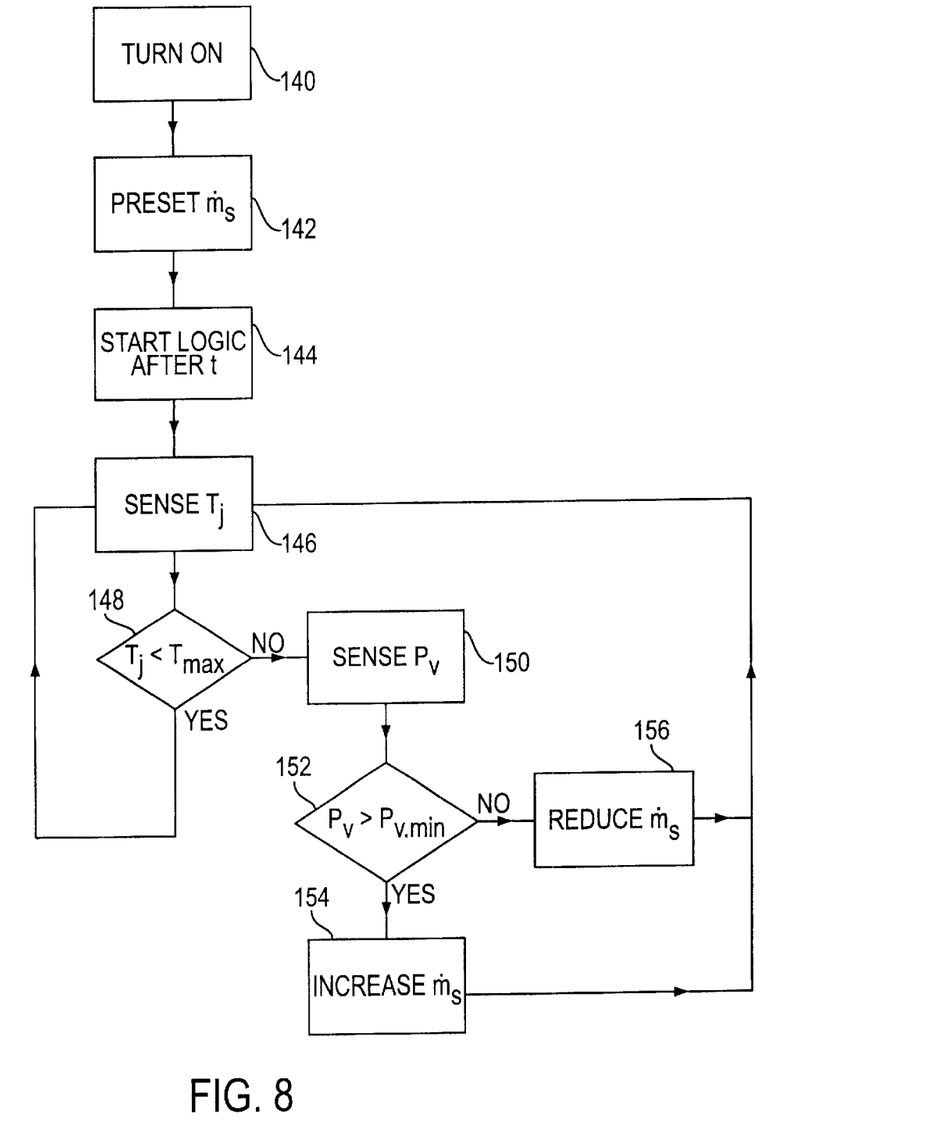
FIG. 8 is a control system block diagram for controlling the operation of the embodiment depicted in FIG. 5.

FIG. 8 is a flowchart depicting a method of adjusting the sprayers' mass flow rate ($\dot{m}_s$) for a cooling device having an internal heat exchanger, such as the device depicted in FIG. 5. The method begins with the steps of starting the cooling system 140 and setting the sprayers' initial mass flow rate 142 at an initial value ($\dot{m}_{s,init}$) This value typically would be based on experimentation, and/or prior experience with this system or systems of its type, but it could be based on an analysis of temperature generation rates and cooling rates. A limited amount of time (t) is preferably allowed to pass 144 prior to starting the actions of the sensing logic, so that the system can begin functioning, and the cooling system can begin sensing and monitoring parameters and adjusting the sensors' mass flow rate. The time (t) is related to the time constant of the system, i.e., the time needed for the system to reach operating temperatures.

In particular, the temperature of the semiconductor devices ($T_j$) is sensed 146, and the resulting sensor value is compared 148 to a selected maximum value $T_{max}$ If the resulting sensor value is below the selected maximum value then no action is taken, and the monitoring of parameters is repeated. If, however, the semiconductor device has reached the selected maximum value, then sensors are used to determine if pooling is occurring. Preferably, to detect pooling, the vapor pressure ($P_v$) in the spray chamber is sensed 150 and compared 152 to a selected minimum value ($P_{v,min}$) to verify that it is above the selected minimum value. To aid in the accurate sensing of the vapor pressure, the system is preferably configured with an internal pressure below atmospheric pressure. The selected minimum value ($P_{v,min}$) is not easy to calculate, and is preferably determined empirically.

If the vapor pressure ($P_v$) in the spray chamber is above the selected minimum value, then pooling is not a problem, and the sprayers' mass flow rate should be increased 154 to reduce the temperature ($T_j$). However, if the vapor pressure ($P_v$) is not above the minimum value, then pooling is occurring and the sprayers' mass flow rate is decreased 156 to increase the cooling system's effectiveness. After the sprayers' mass flow rate is incrementally adjusted, either up or down, the monitoring is continued by again sensing the temperature of the semiconductor devices ($T_j$).

More generally, it will be seen that any sensor reading indicative of the semiconductor's temperature, including direct readings or indirect readings (such as heat dissipation when the heat generation rate is known) can be used to judge whether the cooling is adequate. Furthermore, it will be seen that any sensor reading indicative of pooling, such as vapor flow rate, liquid flow rate, vapor pressure, or others, can be used to judge whether the cooling would be improved by increasing or decreasing the spray flow rate. Additionally, it will be appreciated that, while the order of sensing and decision making contributes to the efficiency of the system, it can be varied within the scope of the invention. For example, both temperature and pooling can be sensed prior to any comparisons. Likewise, pooling can be sensed and compared to a reference value prior to sensing the semiconductor (or other heat-generating device) temperature.

From the foregoing description, it will be appreciated that the present invention provides an accurate, reliable and cost efficient spray cooling system. The system includes a sprayer configured to deliver cooling fluid to a heat-generating device in limited increments. Preferably, the sprayer is thermally driven in a fashion similar to that of an ink-jet print head.

While a particular form of the invention has been illustrated and described, it will be apparent that various modifications can be made without departing from the spirit and scope of the invention. Thus, although the invention has been described in detail with reference only to the preferred embodiments, those having ordinary skill in the art will appreciate that various modifications can be made without departing from the invention. Accordingly, the invention is not intended to be limited, and is defined with reference to the following claims.

We claim:

1. A cooling assembly for cooling a heat source with a cooling fluid, comprising:

a body defining a chamber; and a means for vaporizing a portion of a cooling fluid within the chamber, the chamber having an orifice configured to direct cooling fluid out of the chamber toward the heat source upon the vaporization of the portion of the cooling fluid.

2. The cooling assembly of claim 1, wherein:

the body includes a thin-film substrate and a backing;

the chambers are cavities formed adjoining one side of the thin-film substrate by the backing;

the orifice is a passage through the thin-film substrate; and the means for vaporizing is a thin-film resister.

3. The cooling assembly of claim 2, and further comprising:

a means for sensing if the cooling fluid directed onto the heat source is forming a vapor barrier; and a means for adjusting the rate that cooling fluid is directed onto the heat source based on whether the cooling fluid directed onto the heat source is forming a vapor barrier.

4. The cooling assembly of claim 1, and further comprising:

a means for sensing if the cooling fluid directed onto the heat source is forming a vapor barrier; and a means for adjusting the rate that cooling fluid is directed onto the heat source based on whether the cooling fluid directed onto the heat source is forming a vapor barrier.

5. The cooling assembly of claim 1, and further comprising:

a roll bond panel configured to cool and condense vaporized cooling fluid;

wherein the body is configured to receive condensed cooling fluid from the heat exchanger.

6. A method for cooling a heat source with a cooling fluid, comprising:

vaporizing a portion of cooling fluid within a chamber defined by a body, the chamber having an orifice configured to direct cooling fluid out of the chamber toward the heat source upon the vaporization of the portion of cooling fluid.

7. The method of claim 6, and further comprising:
refilling the chamber; and
repeating the step of vaporizing.

8. The method of claim 6, wherein:
in the step of vaporizing, the chamber is a cavity formed in a backing, the cavity adjoining a thin-film substrate;
the orifice is a passage through the thin-film substrate; and
a thin-film resister vaporizes the portion of cooling fluid.

9. The method of claim 6, and further comprising:
sensing if the cooling fluid directed onto the heat source is forming a vapor barrier; and
adjusting the rate that cooling fluid is directed onto the heat source based on whether the cooling fluid directed onto the heat source is forming a vapor barrier.

10. The method of claim 9, and further comprising:
refilling the chamber; and
repeating the step of vaporizing;
wherein the chamber is a cavity formed in a backing, the cavity adjoining a thin-film substrate;
wherein the orifice is a passage through the thin-film substrate and
wherein, in the step of vaporizing, a thin-film resister vaporizes the portion of cooling fluid.

11. The method of claim 6, and further comprising:
condensing the cooling fluid that was vaporized by the heat source using a roll bond panel; and
routing the condensed cooling fluid to the sprayer.

12. A cooling assembly for cooling a heat source with a cooling fluid, comprising:
a means for spraying a cooling fluid onto the heat source; and
a means for sensing a vapor barrier on the heat source.

13. The cooling assembly of claim 12, and further comprising a means for adjusting the rate that cooling fluid is directed onto the heat source based on whether a vapor barrier has formed on the heat source.

14. The cooling assembly of claim 13, and further comprising:
a means for sensing the temperature of the heat source;
wherein the means for adjusting is configured to adjust the flow rate of the sprayed cooling fluid based on the sensed temperature of the heat source.

15. The cooling assembly of claim 13, wherein the means for spraying is configured to repeatedly spray incremental amounts of cooling fluid.

16. The cooling assembly of claim 15, wherein the means for spraying includes a heating element.

17. The cooling assembly of claim 15, wherein the means for adjusting adjusts the rate that cooling fluid is directed onto the heat source by adjusting the frequency with which incremental amounts of cooling fluid are sprayed.

18. The cooling assembly of claim 13, and further comprising:
a means for sensing the temperature of the heat source;
wherein the means for adjusting is configured to decrease the flow rate if the means for sensing the temperature senses that the heat source temperature is above a predetermined maximum temperature and the pooling sensor indicates that pooling is occurring; and
wherein the means for adjusting is configured to increase the flow rate if the means for sensing the temperature senses that the heat source temperature is above a predetermined maximum temperature and the pooling sensor indicates that pooling is not occurring.

19. A method of limiting the temperature of a heat source, comprising:
cooling the heat source with cooling fluid; and
adjusting the temperature of the heat source based on whether the cooling fluid forms a vapor barrier on the heat source.

20. The method of claim 19, wherein:
the step of cooling includes spraying the cooling fluid on the heat source at a mean flow rate; and
the step of adjusting includes adjusting the mean flow rate that the cooling fluid is sprayed on the heat source.

21. The method of claim 20, and further comprising:
sensing the temperature of the heat source;
wherein in the step of adjusting, the mean flow rate of sprayed cooling fluid is also adjusted based on the sensed temperature of the heat source.

22. The method of claim 21, wherein in the step of adjusting:
if the sensed temperature is above a predetermined maximum temperature and the cooling fluid is forming a vapor barrier on the heat source, the mean flow rate is decreased; and
if the sensed temperature is above a predetermined maximum temperature and the cooling fluid is not forming a vapor barrier on the heat source, the mean flow rate is increased.

23. A method of limiting the temperature of a semiconductor device being sprayed with a cooling fluid at a spray mass flow rate, wherein at least some of the sprayed cooling fluid is vaporized by the semiconductor device, comprising:
a) sensing the temperature of the semiconductor device;
b) sensing whether cooling fluid is forming a vapor barrier on the semiconductor device;
c) increasing the spray mass flow rate if the sensed temperature above a maximum temperature and the cooling fluid is not forming a vapor barrier on the semiconductor device;
d) decreasing the spray mass flow rate if the sensed temperature is above the maximum temperature and the cooling fluid is forming a vapor barrier on the semiconductor device; and
e) repeating steps (a)–(d).

24. The method of claim 23, wherein for each repetition of steps (a)–(d):
prior to the step of sensing whether cooling fluid is forming a vapor barrier, the step of sensing the temperature is conducted repeatedly until the sensed temperature is above the maximum temperature.

25. The method of claim 23, wherein the step of sensing whether cooling fluid is forming a vapor barrier comprises sensing a vapor mass flow rate for cooling fluid vaporized by the semiconductor device.

26. The method of claim 25, wherein:
in the step of increasing the spray mass flow rate, cooling fluid is determined to not be forming a vapor barrier if the vapor mass flow rate is above a minimum vapor mass flow rate; and
in the step of decreasing the spray mass flow rate, cooling fluid is determined to be forming a vapor barrier if the vapor mass flow rate is below the minimum vapor mass flow rate.

27. The method of claim 23, wherein the step of sensing whether cooling fluid is forming a vapor barrier comprises sensing a vapor pressure in a chamber where the semiconductor device is being sprayed.

28. The method of claim 27, wherein:

in the step of increasing the spray mass flow rate, cooling fluid is determined to not be forming a vapor barrier if the vapor pressure is above a selected minimum value; and in the step of decreasing the spray mass flow rate, cooling fluid is determined to be forming a vapor barrier if the vapor pressure is below the selected minimum value.

29. The method of claim 23, wherein the step of sensing whether cooling fluid is forming a vapor barrier comprises sensing a liquid flow rate for cooling fluid sprayed upon, but not vaporized by, the semiconductor device.

* * * * *